United States Patent
Lee

(10) Patent No.: US 10,813,213 B2
(45) Date of Patent: *Oct. 20, 2020

(54) HIGH-FREQUENCY COMPOSITE SUBSTRATE AND INSULATING STRUCTURE THEREOF

(71) Applicant: AZOTEK CO., LTD., Taoyuan (TW)

(72) Inventor: Hung-Jung Lee, Taoyuan (TW)

(73) Assignee: AZOTEK CO., LTD., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/800,051

(22) Filed: Oct. 31, 2017

(65) Prior Publication Data
US 2018/0235072 A1 Aug. 16, 2018

Related U.S. Application Data

(60) Provisional application No. 62/485,403, filed on Apr. 14, 2017.

(30) Foreign Application Priority Data

Feb. 16, 2017 (TW) ............................ 106202228 U
Feb. 17, 2017 (TW) ............................ 106202277 U
(Continued)

(51) Int. Cl.
*H05K 1/02* (2006.01)
*H05K 1/05* (2006.01)
(Continued)

(52) U.S. Cl.
CPC ......... *H05K 1/025* (2013.01); *C09K 19/3809* (2013.01); *H05K 1/0326* (2013.01);
(Continued)

(58) Field of Classification Search
CPC ............................ H05K 1/025; C09K 19/3809
See application file for complete search history.

(56) References Cited

U.S. PATENT DOCUMENTS

| | | |
|---|---|---|
| 5,625,474 A | 4/1997 | Aomori et al. |
| 5,959,708 A | 9/1999 | Lee et al. |

(Continued)

FOREIGN PATENT DOCUMENTS

| | | |
|---|---|---|
| CN | 101470278 A | 7/2009 |
| CN | 102342186 A | 2/2012 |

(Continued)

OTHER PUBLICATIONS

Dutta et al., "Blends containing liquid crystalline polymers: Preparation and properties of melt-drawn fibers, unidirectional prepregs, and composite laminates," Poly.Comp. vol. 13 (1992) 394-401. (Year: 1992).*

(Continued)

*Primary Examiner* — Callie E Shosho
*Assistant Examiner* — John Vincent Lawler
(74) *Attorney, Agent, or Firm* — CKC & Partners Co., LLC

(57) ABSTRACT

The present disclosure provides a high-frequency composite substrate which includes a metal layer and an insulating structure. The insulating structure includes at least one liquid crystal polymer (LCP) layer with dielectric constant ranged from about 2 to about 4. The liquid crystal polymer layer adheres to the metal layer. The high-frequency composite substrate may reduce the adverse effects caused by the Resistor-Capacitor delay (RC delay).

18 Claims, 4 Drawing Sheets

(30) Foreign Application Priority Data

Jul. 17, 2017 (TW) .............................. 106123857 A
Aug. 10, 2017 (TW) .............................. 106127157 A

(51) Int. Cl.
    *C09K 19/38* (2006.01)
    *H05K 1/03* (2006.01)

(52) U.S. Cl.
    CPC ........... *H05K 1/0346* (2013.01); *H05K 1/056* (2013.01); *C09K 2219/11* (2013.01); *H05K 2201/0141* (2013.01)

(56) References Cited

U.S. PATENT DOCUMENTS

| | | | |
|---|---|---|---|
| 6,994,896 B2 | 2/2006 | Sethumadhavan et al. | |
| 7,387,858 B2 | 6/2008 | Chari et al. | |
| 8,465,670 B2* | 6/2013 | Kondo ................. | C09D 167/03 174/250 |
| 8,711,300 B2 | 4/2014 | Yamamoto et al. | |
| 2003/0178227 A1 | 9/2003 | Matsunaga et al. | |
| 2009/0111949 A1* | 4/2009 | Cho ........................ | C08G 73/18 525/417 |
| 2010/0326696 A1* | 12/2010 | Mahapatra ............. | H01B 3/445 174/110 SR |
| 2011/0256363 A1 | 10/2011 | Satou | |
| 2011/0315438 A1 | 12/2011 | Ito et al. | |
| 2013/0146344 A1 | 6/2013 | Lee et al. | |
| 2014/0087165 A1* | 3/2014 | Nair ...................... | C09D 167/00 428/220 |
| 2014/0231123 A1* | 8/2014 | Onodera ................ | H05K 1/032 174/255 |

FOREIGN PATENT DOCUMENTS

| | | |
|---|---|---|
| CN | 103917582 A | 7/2014 |
| JP | 05-090740 A | 4/1993 |
| JP | 08-097565 A | 4/1996 |
| JP | 3208028 B2 | 9/2001 |
| JP | 2001274554 A | 10/2001 |
| JP | 2001284801 A | 10/2001 |
| JP | 200311284 A | 1/2003 |
| JP | 2006-8976 A | 1/2006 |
| JP | 2006-282678 A | 10/2006 |
| JP | 2007070418 A | 3/2007 |
| JP | 2007081433 A | 3/2007 |
| JP | 2007-161835 A | 6/2007 |
| JP | 2007235167 A | 9/2007 |
| JP | 2007253366 A | 10/2007 |
| JP | 2008-37982 A | 2/2008 |
| JP | 2009246200 A | 10/2009 |
| JP | 2010-168410 A | 8/2010 |
| JP | 2010-532567 A | 10/2010 |
| JP | 2011032316 A | 2/2011 |
| JP | 2011080170 A | 4/2011 |
| JP | 2011134884 A | 7/2011 |
| JP | 2011216841 A | 10/2011 |
| JP | 2012033869 A | 2/2012 |
| JP | 2012046742 A | 3/2012 |
| JP | 2012242442 A | 12/2012 |
| JP | 2012242622 A | 12/2012 |
| JP | WO2011018837 A1 | 1/2013 |
| JP | 2014120580 A | 6/2014 |
| JP | 2014533325 A | 12/2014 |
| JP | 2015183159 A | 10/2015 |
| JP | 2016062954 A | 4/2016 |
| JP | 2017075339 A | 4/2017 |
| KR | 10-2011-0073272 A | 6/2011 |
| KR | 1020120001623 A | 1/2012 |
| KR | 10-2013-0047456 A | 5/2013 |
| KR | 10-2016-0002401 A | 1/2016 |
| TW | 538663 | 6/2003 |
| TW | 201328443 A1 | 7/2013 |
| TW | 201706689 A | 2/2017 |
| WO | 2004070694 A2 | 8/2004 |
| WO | 2013065453 A1 | 5/2013 |
| WO | 2014147903 A1 | 9/2014 |
| WO | 2015050080 A1 | 4/2015 |
| WO | 2018056294 A1 | 3/2018 |
| WO | 2018101214 A1 | 6/2018 |

OTHER PUBLICATIONS

Woznicki, "Films and Adhesives," Flex Circuit News, Aug. 2001 (Year: 2001).*
Okamoto et al., "Newly developed LCP film fabricate by solvent-casting method," Suitomo Kagaku 2005-I (Year: 2005).*
Sinh—Prop AIN-LCP ester-amide composite—NMP—2012 (Year: 2012).*
62-485,403, Specification,—Provisional application—Jan. 11, 2018 (Year: 2018).*

* cited by examiner

HIGH-FREQUENCY COMPOSITE SUBSTRATE AND INSULATING STRUCTURE THEREOF

RELATED APPLICATIONS

This application claims priority to U.S. Provisional Application Ser. No. 62/485,403, filed Apr. 14, 2017, and Taiwan Application Serial Number 106127157, filed Aug. 10, 2017, which are herein incorporated by reference.

BACKGROUND

Field of Invention

The present invention relates to a high-frequency composite substrate. More particularly, the present invention relates to a high-frequency composite substrate including liquid-crystal polymer (LCP).

Description of Related Art

Nowadays, the clock rate of the central processing unit (CPU) used in mobile devices such as smart phones, tablet computers, and laptops is more than gigahertz (GHz), so that conventional mobile device needs to use high-frequency circuits to match the central processing unit having gigahertz clock rate. In order to meet the needs for high-frequency circuits, conventional mobile devices need to reduce the adverse effects caused by the Resistor-Capacitor delay (RC delay).

SUMMARY

The present disclosure provides a high-frequency composite substrate which includes a metal layer and an insulating structure. The insulating structure includes at least one liquid crystal polymer (LCP) layer with dielectric constant ranged from about 2 to about 4. The liquid crystal polymer layer adheres to the metal layer.

In some embodiments of the present disclosure, the LCP layer includes a soluble LCP. The soluble LCP may be soluble in a certain solvent. The certain solvent may be one or more materials selected from N-methyl-2-pyrrolidone, N,N-dimethylacetamide, γ-butyrolactone, dimethylformamide, 2-butoxyethanol, and 2-eyhoxyethanol.

In some embodiments of the present disclosure, the soluble LCP is an aromatic liquid crystal polyester.

In some embodiments of the present disclosure, the soluble LCP includes a LCP and an aromatic polymer. The aromatic polymer may be one or more materials selected from an aromatic polyester, an aromatic polyamide, a poly para-phenylene terephthalamide, a poly (p-phenylene-2,6-benzobisoxazole), and a poly (p-hydroxybenzoic acid)-co-2-hydroxy-6-naphthoic acid.

In some embodiments of the present disclosure, the LCP of the soluble LCP has a repeating unit represented by formula below:

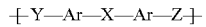

In the above formula, Ar may be 1,4-phenylene, 1,3-phenylene, 2,6-naphthalene, or 4,4'-biphenylene, Y may be —O—, or —NH—, Z may be —C=O—, and X may be an amino group, a carboxamido group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, a carboxyl ester group, a (carboxyl ester)amino group, an (alkoxycarbonyl)oxy group, an alkoxycarbonyl group, a hydroxyamino group, an alkoxyamino group, a cyanato group, an isocyanato group, or a combination thereof.

In some embodiments of the present disclosure, the insulating structure may include a plurality of liquid crystal polymer layers stacking each other.

In some embodiments of the present disclosure, the insulating structure may further include an adhesive layer. The LCP layer is disposed between the metal layer and the adhesive layer.

In some embodiments of the present disclosure, the adhesive layer may be one or more materials selected from epoxy resins, phenoxy resins, poly (acrylic acid) resins, polyurethane resins, silicone rubbers, poly-p-xylene resins, liquid crystal polymers, bismaleimide resins, and polyimide resins.

The present disclosure provides a high-frequency composite substrate which includes a metal layer, a polymer layer, and at least one liquid crystal polymer layer. The liquid crystal polymer layer is disposed between the polymer layer and the metal layer.

In some embodiments of the present disclosure, the liquid crystal polymer layer includes a soluble LCP. The soluble LCP has a repeating unit represented by formula below:

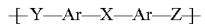

In the above formula, Ar may be 1,4-phenylene, 1,3-phenylene, 2,6-naphthalene, or 4,4'-biphenylene, Y may be —O—, or —NH—, Z may be —C=O—, and X may be an amino group, a carboxamido group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, a carboxyl ester group, a (carboxyl ester)amino group, an (alkoxycarbonyl)oxy group, an alkoxycarbonyl group, a hydroxyamino group, an alkoxyamino group, a cyanato group, an isocyanato group, or a combination thereof.

In some embodiments of the present disclosure, the soluble LCP may be soluble in N-methyl-2-pyrrolidone, N,N-dimethylacetamide, γ-butyrolactone, dimethylformamide, 2-butoxyethanol, or 2-eyhoxyethanol.

In some embodiments of the present disclosure, the soluble LCP includes a LCP and an aromatic polymer. The aromatic polymer may be one or more materials selected from an aromatic polyester, an aromatic polyamide, a poly para-phenylene terephthalamide, a poly (p-phenylene-2,6-benzobisoxazole), and a poly (p-hydroxybenzoic acid)-co-2-hydroxy-6-naphthoic acid.

In some embodiments of the present disclosure, the polymer layer includes a material which is selected from the group consisting of a polyimide, a polytetrafluoroethylene, a polyethylene, a polypropylene, a polystyrene, a polyvinylchloride, a polyamide, a polyacidmethylester, an ABS plastic, a phenolic resin, an epoxy resin, a polyester, a polyethylene terephthalate, a silicone, a glass fiber, and a polyurethane.

In some embodiments of the present disclosure, the high-frequency composite substrate may further include an adhesive layer. The adhesive layer is disposed between the LCP layer and the metal layer.

In some embodiments of the present disclosure, the adhesive layer includes a material which is selected from the group consisting of an epoxy resin, a phenoxy resin, a poly (acrylic acid) resin, a polyurethane resin, a silicone rubber, a poly-p-xylene resin, a liquid crystal polymer, a bismaleimide resin, and a polyimide resin.

The present disclosure provides a high-frequency composite substrate which includes at least two metal layers and an insulating structure. The insulating structure is disposed between the metal layers. The insulating structure includes a plurality of liquid crystal polymer layers which is disposed between the metal layers.

The present disclosure provides a liquid crystal composition. The liquid crystal composition includes a solvent and an aromatic liquid crystal polyester. The aromatic liquid crystal polyester has a repeating unit represented by formula below:

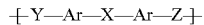

In the above formula, Ar may be 1,4-phenylene, 1,3-phenylene, 2,6-naphthalene, or 4,4'-biphenylene, Y may be —O—, or —NH—, Z may be —C=O—, and X may be an amino group, a carboxamido group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, a carboxyl ester group, a (carboxyl ester)amino group, an (alkoxycarbonyl)oxy group, an alkoxycarbonyl group, a hydroxyamino group, an alkoxyamino group, a cyanato group, an isocyanato group, or a combination thereof.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
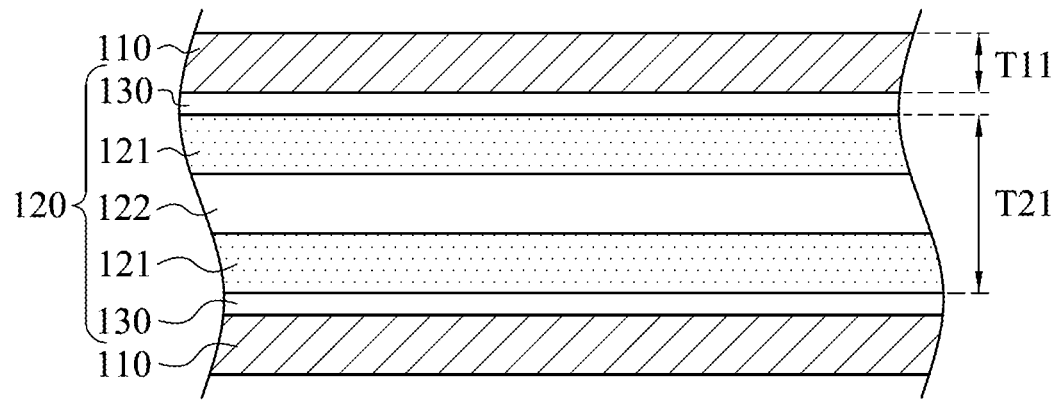
FIG. 1 is cross-sectional views of the high-frequency composite substrate in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The terminology used herein is for the purpose of describing particular embodiments only and is not intended to be limiting of the invention. As used herein, the singular words are intended to include the plural forms as well, unless the context clearly indicates otherwise. By referring to a specific allegation, such as "one embodiment", represents a particular feature, structure, or characteristic in at least one of the embodiments of the present invention. Therefore, it is not necessary to refer to the same embodiment when the phrase like "in one embodiment" appears everywhere through a special allegation. Furthermore, in one or more embodiments, these particular features, structures, or characteristics may be combined with each other in a suitable situation.

Please refer to FIG. 1. A high-frequency composite substrate 100 includes a plurality of metal layers 110 and an insulating structure 120. The insulating structure 120 is disposed between the metal layers 110 and adheres to the metal layers 110.

In some embodiments, the material, which constitutes the metal layer 110, includes copper, aluminum, iron, silver, palladium, nickel, chromium, molybdenum, tungsten, zinc, chromium, manganese, cobalt, gold, tin, lead, or stainless steel, or an alloy including at least two of the metallic materials mentioned above. To be specific, the metal layer 110 may be a metal foil, such as copper foil, aluminum foil, tin foil, or/and gold foil. Furthermore, the metal layer also may be a redistribution layer after etching.

In some embodiments, the thickness T11 of the metal layer 110 may be between about 1 micrometer and about 2000 micrometers. In addition, the roughness of the surface between the metal layer 110 and the insulating structure 120 may be about 0.2 um to about 5 um, for example 0.5 um, 1 um, 1.5 um, 2 um, 2.5 um, 3 um, 3.5 um, 3.5 um, 4 um, and 4.5 um. When the roughness of the surface is less than about 0.2 um or greater than 5 um, the surface of the metal layer 110 has a poor combination with the insulating structure 120 and easily peels off due to other external stress.

In some embodiments, the surface of the metal layer 110 may be plated such that the surface of the metal layer 110 may be covered with a plating layer. For example, the surface of the metal layer 110 may be plated with nickel gold, zinc, or cobalt such that the coating layer (not shown) may be further included between the metal layer 110 and the insulating structure 120.

In some embodiments, the insulating structure 120 includes a polymer layer 122 and multilayer (at least two layers) liquid crystal polymer layers 121 stacking each other. The polymer layer 122 is interposed between the liquid crystal polymer layers 121, and the liquid crystal polymer layers 121 are interposed between the polymer layer 122 and the metal layer 110. In addition, the thickness T21 of the insulating structure 120 as shown in FIG. 1 may be from about 5 um to about 2000 um.

In some embodiments, the polymer layer 122 may have good flexibility such that the composite substrate 100 including the polymer layer 122 may be flexible. The materials constituting the polymer layer 122 may be selected from the group consisting of polyimide, polytetrafluoroethylene, polyethylene, polypropylene, polystyrene, polyvinyl chloride, polyamides, polyacidmethylester, ABS plastic, phenolic resins, epoxy resins, polyester, poly(ethylene terephthalate), silicone, glass fibers, and poly ethyl carbamate.

In some embodiments, the liquid crystal polymer layer 121 includes a soluble liquid crystal polymer. The soluble liquid crystal polymer includes a liquid crystal polymer and an aromatic polymer. The aromatic polymer may be one or more materials selected from an aromatic polyester, an aromatic polyamide, a poly para-phenylene terephthalamide (PPTA), a poly (p-phenylene-2,6-benzobisoxazole) (PBO), and a poly (p-hydroxybenzoic acid)-co-2-hydroxy-6-naphthoic acid. It is noted that the material of each liquid crystal polymer layer 121 may be different.

More specifically, the liquid crystal polymer of the soluble liquid crystal polymer has a repeating unit represented by formula below:

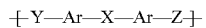

In the above formula, Ar may be 1,4-phenylene, 1,3-phenylene, 2,6-naphthalene, or 4,4'-biphenylene, Y may be —O—, or —NH—, Z may be —C=O—, and X may be an amino group, a carboxamido group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, a carboxyl ester group, a (carboxyl ester)amino group, an (alkoxycarbonyl)oxy group, an alkoxycarbonyl group, a hydroxyamino group, an alkoxyamino group, a cyanato group, an isocyanato group, or a combination thereof, but not limited thereto. Comparing with the traditional liquid crystal polymer, the solubility of the soluble liquid crystal polymer in the certain solvent is higher than that of the traditional liquid crystal polymer.

In one example, the soluble liquid crystal polymer of the liquid crystal polymer layer 121 is formed by an aromatic liquid crystal polyester solution. The aromatic liquid crystal polyester solution includes a solvent and an aromatic liquid crystal polyester, that is, the aromatic liquid crystal polyester has a good solubility in the solvent, in which the weight percentage of the aromatic liquid crystal polyester may be ranged from about 1 wt % to about 85 wt %. The weight percentage of the solid content of the aromatic liquid crystal polyester may be 5 wt %, 15 wt %, 25 wt %, 35 wt %, 45 wt %, 55 wt %, 65 wt %, or 75 wt %, for example. When the weight percentage of the solid aromatic liquid crystal polyester is less than about 1 wt %, the liquid crystal polymer layer 121 needs to perform a plurality of coating processes to achieve the required thickness which is costly and time consuming considerably. However, when the weight percentage of the solid aromatic liquid crystal polyester is greater than 85 wt %, the solid content of the aromatic liquid crystal polyester is not easily dissolved in the solvent, thereby generating gelatinization. To be specific, the aromatic liquid crystal polyester has a repeating unit represented by formula below:

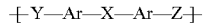

In the above formula, Ar may be 1,4-phenylene, 1,3-phenylene, 2,6-naphthalene, or 4,4'-biphenylene, Y may be —O—, or —NH—, Z may be —C=O—, and X may be an amino group, a carboxamido group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, a carboxyl ester group, a (carboxyl ester)amino group, an (alkoxycarbonyl)oxy group, an alkoxycarbonyl group, a hydroxyamino group, an alkoxyamino group, a cyanato group, an isocyanato group, or a combination thereof. The solvent in the aromatic liquid crystal polyester solution may be selected from the group consisting of N-Methyl-2-pyrrolidone, N,N-dimethylacetamide, gamma-butyrolactone, dimethylformamide, 2-butoxyethanol, and 2-eyhoxyethanol.

It is worth mentioning that the aromatic liquid crystal polyester solution may further include one or more additives. For example, illustrative examples of the additives include inorganic fillers such as silicon dioxide, aluminum hydroxide, and calcium carbonate; high dielectric constant fillers such as barium titanate and strontium titanate; whiskers such as potassium titanate and aluminum titanate; organic fillers such as cured epoxy resins, cross-linked benzo-carnosine resins, and cross-linked acrylic polymers; silane coupling agents; antioxidants; and UV absorbers, but not limited thereto.

After removing the solvent of the aromatic liquid crystal polyester solution, the LCP layer 121 is formed.

According to the other embodiments of the present invention, the liquid crystal polymer layer 121 may be composed of a liquid crystal polymeric film. It is worth mentioning that the liquid crystal polymeric film is the traditional liquid crystal polymer. The material, which constitutes the liquid crystal polymeric film, includes a liquid crystal polymer without the repeating unit mentioned above and one or more polymers selected from aromatic polyester, aromatic polyamide, poly para-phenylene terephthalamide, poly(p-phenylene-2,6-benzobisoxazole), and a poly(p-hydroxybenzoic acid)-co-2-hydroxy-6-naphthoic acid, but not limited thereto. In other embodiments, the liquid crystal polymer layer 121 may be formed by using the soluble liquid crystal polymer solution or the liquid crystal polymeric film.

The traditional liquid crystal polymeric film is formed by injection molding to form the liquid crystal polymer layer 121. It is noted that the traditional liquid crystal polymer requires to be heated up to the melting point of about 320° C. or more to form a molten type in the process, and the liquid crystal molecular of the traditional liquid crystal polymer has a isotropy arrangement in a certain direction by the process of injection molding. However, the soluble liquid crystal polymer may be coated at a temperature in the range from about 40° C. to about 160° C., and the liquid crystal molecular of the soluble liquid crystal polymer are randomly arranged at this time. Therefore, the liquid crystal polymer layer 121 formed by the soluble liquid crystal polymer may reduce the processing time and the equipment costs and the liquid crystal polymer layer is less prone to peel or crack in the specific direction for comparison with the liquid crystal polymer layer 121 formed by the liquid crystal polymeric film.

The high-frequency composite substrate 100 may further include multiple layers of sticky adhesive layer 130 which may be interposed between the liquid crystal polymer layers 121, or may be interposed between the metal layer 110 and the liquid crystal polymer layer 121. In some embodiments, the adhesive layer 130 may be made of an epoxy resin, a phenoxy resin, a poly (acrylic acid) resin, a polyurethane resin, a silicone rubber, a poly-p-xylene resin, a liquid crystal polymer, a bismaleimide resin, a polyimide resin, or at least two of these resin materials. Please refer to FIG. 1; the adhesive layer 130 is interposed between the metal layer 110 and the liquid crystal polymer layer 121. The binding force between the liquid crystal polymer layer 121 and the metal layer 110 may be enhanced by the adhesive layers 130. However, it must be stated that no adhesive layer 130 may be included in the high-frequency composite substrate 100, that is, the liquid crystal polymer layer 121 may also be formed between the polymer layer 122 and the metal layer 110. Then, all adhesive layers 130 may be omitted in some embodiments of the present invention.

The high-frequency composite substrate 100 may be used to fabricate a circuit board in the present embodiments. The metal layer 110 in the high-frequency composite substrate 100 may serve as a circuit layer in the circuit board, and the insulating structure 120 may serve as an interposer in the circuit board. For example, when the high-frequency composite substrate 100 is a flex copper clad laminate (FCCL), the high-frequency composite substrate 100 is flexible, and therefore the high-frequency composite substrate 100 may use to fabricate flexible circuit boards. However, when the high-frequency composite substrate 100 is a copper clad laminate (CCL) and the polymer layer 122 is a glass-reinforced epoxy, the high-frequency composite substrate 100 is rigid, and therefore the high-frequency composite substrate 100 may use to fabricate rigid circuit boards, wherein the rigid circuit boards may represent printed circuit boards (PCBs).

The insulating structure 120 includes multiple liquid crystal polymer layers 121 with a low dielectric constant (for example, between about 2 and about 4), so it is possible to reduce the capacitance generated by the high-frequency composite substrate 100 or reduce the capacitance generated by the circuit board made of the high-frequency composite substrate 100. The capacitance mentioned above may be a parasitic capacitance, for example. Therefore, the insulating structure 120 may reduce the adverse effect caused by the capacity-resistance delay to meet the need of the high-frequency circuit.

It is worth mentioning that the high-frequency composite substrate 100 as shown in FIG. 1, the number of the metal layer 110 is two, and the number of the liquid crystal polymer layer 121 is also two such that the high-frequency composite substrate 100 may be used to manufacture the double sided circuit board. However, the number of the metal layer 110 in the high-frequency composite substrate 100 may be one and the number of the liquid crystal polymer layer 121 may be also one in other embodiments; hence the number both of the metal layer 110 and the liquid crystal polymer layer 121 are not limited to two or more, but depending upon the high-frequency composite substrate 100, such as the single sided circuit board or the multilayer circuit board. In addition, all adhesive layer 130 in FIG. 1 may be omitted due to the liquid crystal polymer layer 121 may be directly formed on the polymer layer 122 or the metal layer 110 may be directly formed on the liquid crystal polymer layer 121.

It is worth mentioning that the insulating structure 120 in the embodiment of the present disclosure may be formed individually without using the metal layer as a matrix, and even may be made directly as a dielectric layer or an insulating layer. In other words, the high-frequency composite substrate 100 may be formed individually without the metal layer 110 and the adhesive layer 130.

Figure 2:
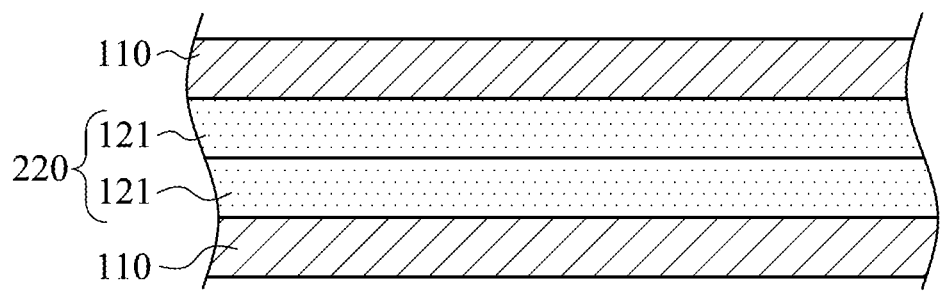
FIG. 2 is cross-sectional views of the high-frequency composite substrate in accordance with various embodiments of the present disclosure.

Please refer to FIG. 2, which illustrates a high-frequency composite substrate 200 in accordance with some embodiments of the present disclosure. The high-frequency composite substrate 200 is similar to the high-frequency composite substrate 100 of the foregoing embodiment. For example, the high-frequency composite substrate 200 includes an insulating structure 220 and multiple (at least two) metal layers 110. However, the different between the high-frequency composite substrate 200 and the high-frequency composite substrate 100 is that the insulating structure 220 of the high-frequency composite substrate 200 includes multiple liquid crystal polymer layers 121, but the polymer layer 122 as shown in FIG. 1 does not. The liquid crystal polymer layers 121 are connected to each other and interposed between the metal layers 110. The material of the liquid crystal polymer layer 121 in the insulating structure 220 may be similar to that of the liquid crystal polymer layer 121 in the insulating structure 120. The contact surface between the metal layer 110 and the liquid crystal polymer layer 121 has a roughness of about 0.2 um to about 5 um. If this happens then the adhesive layer 130 as shown in FIG. 1 may not be included in the high-frequency composite substrate 200. Furthermore, the same technical features relating to both the high-frequency composite substrate 200 and 100 are described in the foregoing description, and it is not repeated here.

Figure 3:
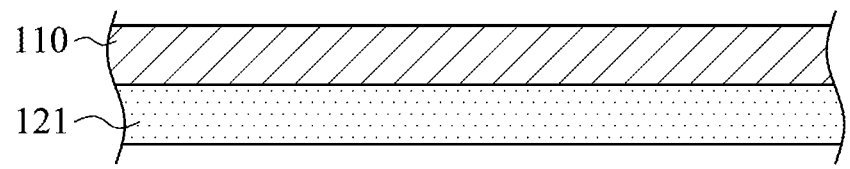
FIG. 3 is cross-sectional views of the high-frequency composite substrate in accordance with various embodiments of the present disclosure.

Please refer to FIG. 3. One metal layer 110 and an insulating structure may be included in the high-frequency composite substrate 300. The insulating structure includes only one liquid crystal polymer layer 121 connected to the metal layer 110. Actually, in other embodiments, the insulating structure as shown in FIG. 3 may include multiple liquid crystal polymer layers 121 (not shown) and may further include a polymer layer 122 (not shown) interposed between the metal layer 110 and the liquid crystal polymer layer 121 or a liquid crystal polymer layer 121 interposed between the polymer layer 122 and the metal layer 110. The thickness of the insulating structure (the thickness of the liquid crystal polymer layer 121 plus the thickness of the polymer layer 122) may be equal to the thickness T21 marked in FIG. 1. In other embodiments, the adhesive layer 130 may be added selectively between the metal layer 110 and the liquid crystal polymer layer 121, or between the liquid crystal polymer layer 121 and the polymer layer 122, or between the metal layer 110 and the polymer layer 122. In addition, the thickness of the liquid crystal polymer layer 121 in FIG. 3 may be equal to the thickness T21 marked in FIG. 1.

Figure 4:
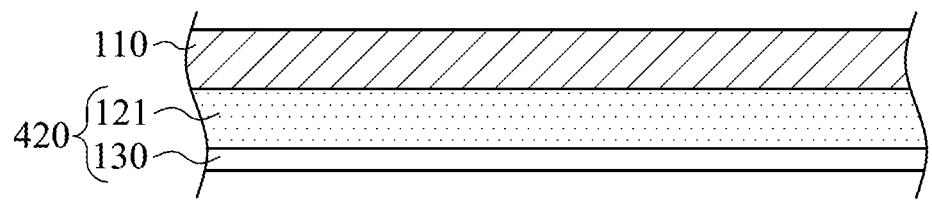
FIG. 4 is cross-sectional views of the high-frequency composite substrate in accordance with various embodiments of the present disclosure.

Furthermore, the liquid crystal polymer layer 121 is formed directly on the metal layer 110 in the embodiment of FIG. 3, but the adhesive layer 130 may be formed on the liquid crystal polymer layer 121 in other embodiments, so that the liquid crystal polymer layer 121 is interposed between the adhesive layer 130 and the metal layer 110 as shown in FIG. 4 of the high-frequency composite substrate 400. Please refer to FIG. 4; the high-frequency composite substrate 400 includes a metal layer 110 and an insulating structure 420. The insulating structure 420 not only includes a liquid crystal polymer layer 121 but includes an adhesive layer 130. In addition, the thickness of the insulating structure 420 in FIG. 4 may be equal to the thickness T21 marked in FIG. 1.

Figure 5:
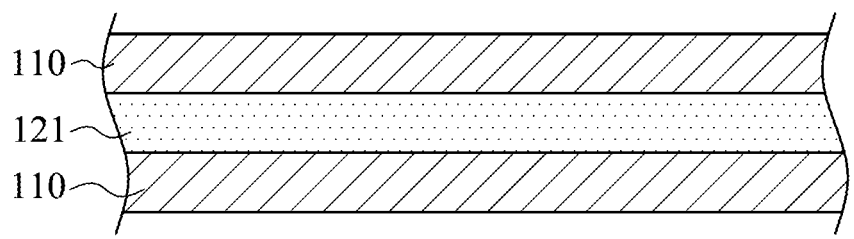
FIG. 5 is cross-sectional views of the high-frequency composite substrate in accordance with various embodiments of the present disclosure.

Please refer to FIG. 5. The high-frequency composite substrate 500 includes at least two metal layers 110 and an insulating structure. The insulating structure includes only one liquid crystal polymer layer 121 interposed between the metal layers 110.

Figure 6:
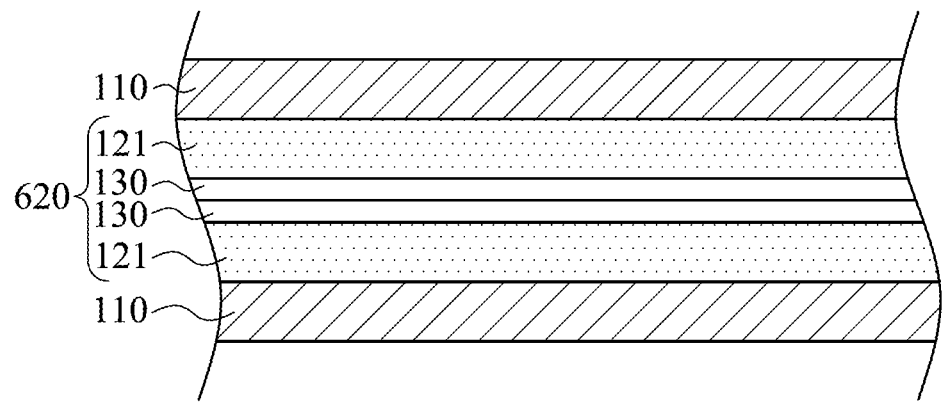
FIG. 6 is cross-sectional views of the high-frequency composite substrate in accordance with various embodiments of the present disclosure.

Please refer to FIG. 6. In other embodiments of the present invention, the high-frequency composite substrate 600 includes at least two metal layers 110 and an insulating structure 620. The insulating structure 620 includes at least two liquid crystal polymer layers 121 and at least two adhesive layers 130 and the insulating structure 620 interposed between the metal layers 110. The adhesive layers 130 are connected to each other and are interposed between the liquid crystal polymer layers 121, so as to form the structure of the high-frequency composite substrate 600 illustrated in FIG. 6.

Figure 7:
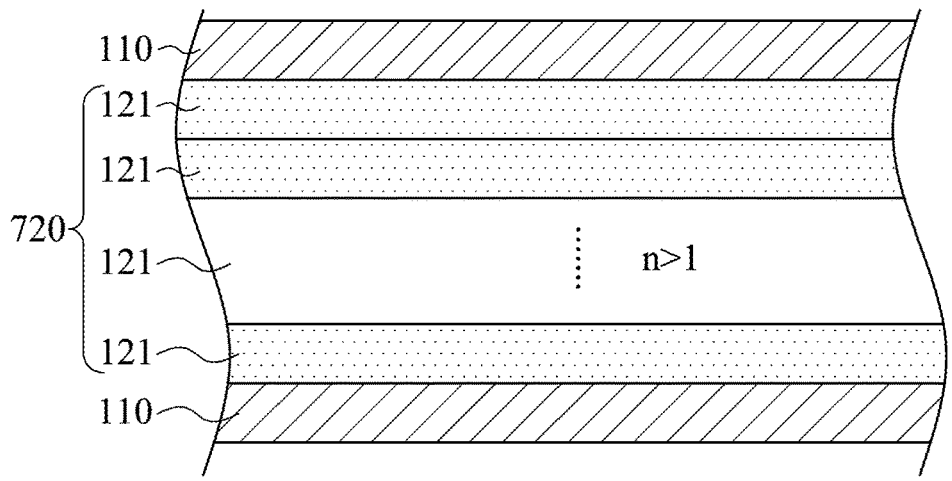
FIG. 7 is cross-sectional views of the high-frequency composite substrate in accordance with various embodiments of the present disclosure.

Please refer to FIG. 7, which illustrates the structure of the high-frequency composite substrate 700 in accordance with other embodiments of the present disclosure. The high-frequency composite substrate 700 includes at least two metal layers 110 and an insulating structure 720. The insulating structure 720 includes a plurality of liquid crystal polymer layers 121 stacking each other and disposed between the metal layers 110. In other embodiments, the insulating structure 720 may include a polarity of polymer layers 122 (not shown) disposed over, between, and below the liquid crystal polymer layers 121. In addition, the insulating structure 720 may further include at least one adhesive layer 130 interposed between the metal layer 110 and the liquid crystal polymer layer 121, or between the liquid crystal polymer layer 121 and the liquid crystal polymer layer 121, or between the metal layer 110 and the polymer layer 122, or between the liquid crystal polymer layer 121 and the polymer layer 122, or between the polymer layer 122 and the polymer layer 122.

Figure 8:
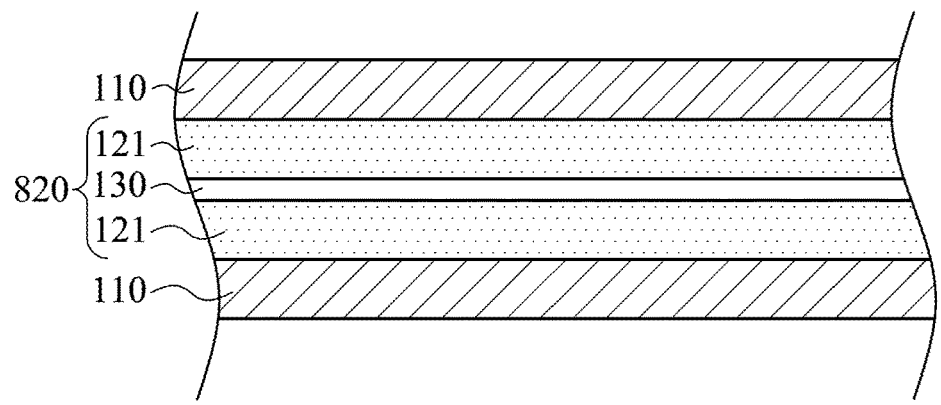
FIG. 8 is cross-sectional views of the high-frequency composite substrate in accordance with various embodiments of the present disclosure.

Please refer to FIG. 8. In other embodiments, the high-frequency composite substrate 800 includes at least two metal layers 110 and an insulating structure 820. The insulating structure 820 includes two liquid crystal polymer layers 121 and an adhesive layer 130 disposed between the liquid crystal polymer layers 121. The structure of the high-frequency composite substrate 800 is shown on FIG. 8 and the insulating structure 820 is interposed between the metal layers 110.

Figure 9:
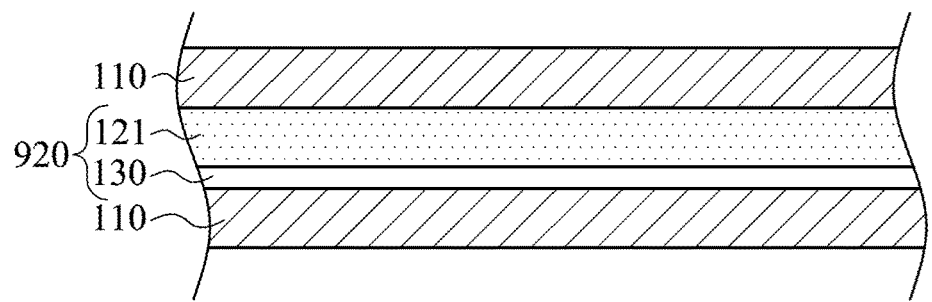
FIG. 9 is cross-sectional views of the high-frequency composite substrate in accordance with various embodiments of the present disclosure.

Please refer to FIG. 9. In other embodiments, the high-frequency composite substrate 900 includes at least two metal layers 110 and an insulating structure 920. The insulating structure 920 includes one liquid crystal polymer layer 121 and one adhesive layer 130. The structure of the high-frequency composite substrate 900 is shown on FIG. 9 and the insulating structure 920 is interposed between the metal layers 110.

Figure 10:
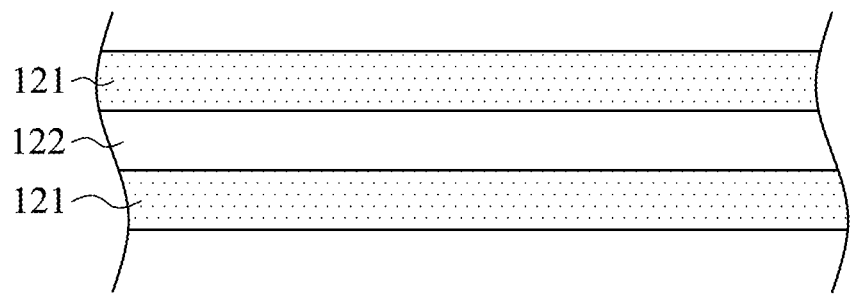
FIG. 10 is a cross-sectional view of the insulating structure in accordance with various embodiments of the present disclosure.
Figure 11:
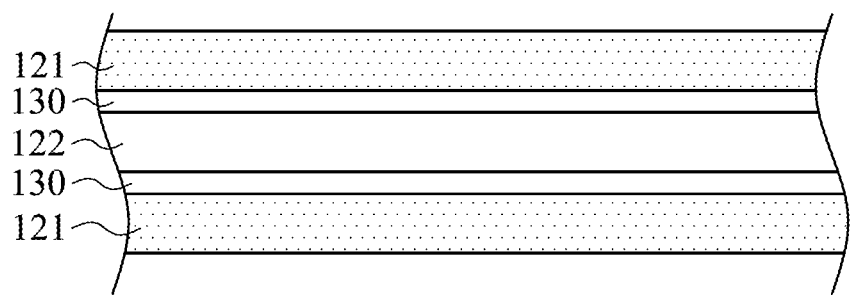
FIG. 11 is a cross-sectional view of the insulating structure in accordance with various embodiments of the present disclosure.

FIG. 10 and FIG. 11 are cross-sectional views of the insulating structure in accordance with various embodiments of the present disclosure. Please refer to FIG. 10 and FIG. 11; the insulating structure includes a polymer layer 122 and at least two liquid crystal polymer layers 121. The polymer layer 122 is disposed between the liquid crystal polymer layers 121. The insulating structure may further include an adhesive layer 130 interposed between the liquid crystal polymer layer 121 and the polymer layer 122 and connected the liquid crystal polymer layer 121 to the polymer layer 122. To be specific, if a high-frequency composite substrate is to be formed, metal layers or substrates which are known in the art may be formed separately over and below the insulating structure so that the insulating structure is disposed between the metal layers (or the substrates). In addition, the adhesive layer 130 may be interposed between the metal layer (and the substrate) and the liquid crystal polymer layer 121. More specifically, processing processes (such as drilling and filling) may be performing on the insulating structure and the high-frequency composite substrate may be formed by adhering the metal layer (or the substrate) to the insulating structure, and then the follow-up processing process (such as lithography) may be carried out. Furthermore, the thickness of the insulating structure may be equal to the thickness T21 marled in FIG. 1. The insulating structure may also serve as a cover layer for covering the metal substrate (not shown), wherein the metal substrate (not shown) may be a circuit substrate, such as a flexible circuit board or a rigid circuit board. It is noted that all adhesive layer 130 may be omitted in the embodiments listed above.

Given above, since the soluble LCP which has a fixed melting point and a high plasticity is used in the LCP layer, the surface depression of the substrate may be filled evenly during the process so as to provide a flat surface in the follow up process, which may reduce the sticky, squeeze and other damage situation of the circuit. Furthermore, due to using the LCP with a low dielectric constant (for example, between about 2 and about 4), a circuit board which is fabricated by the composite substrate including the LCP layer in the above embodiments may reduce the capacitance (such as parasitic capacitance) generated by the circuit board and may reduce the negative impact of resistor-capacitor delay. The use of the composite substrate including the LCP layer to fabricate the circuit board may meet the needs of high-frequency circuits and may be applied to today's mobile devices (such as smart phones and tablet computers).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A high-frequency composite substrate, comprising:
a metal layer; and
an insulating structure, comprising:
at least one liquid crystal polymer layer adhering to the metal layer, wherein the liquid crystal polymer layer comprises a soluble liquid crystal polymer which comprises a repeating unit represented by formula below:

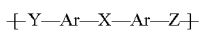

wherein Ar is 1,4-phenylene, 1,3-phenylene, 2,6-naphthalene, or 4,4'-biphenylene, Y is O, or NH, Z is C=O, and X is an amino group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, an (alkoxycarbonyl)oxy group, a hydroxyamino group, an alkoxyamino group, a cyanato group, an isocyanato group, or a combination thereof.

2. The high-frequency composite substrate of claim 1, wherein the soluble liquid crystal polymer may be soluble in N-Methyl-2-pyrrolidone, N, N-dimethylacetamide, γ-butyrolactone, dimethylformamide, 2-butoxyethanol, and/or 2-eyhoxyethanol.

3. The high-frequency composite substrate of claim 2, wherein the soluble liquid crystal polymer is an aromatic liquid crystal polyester.

4. The high-frequency composite substrate of claim 2, wherein the soluble liquid crystal polymer comprises a liquid crystal polymer and an aromatic polymer which is selected from the group consisting of an aromatic polyester, an aromatic polyamide, a poly para-phenylene terephthalamide, a poly(p-phenylene-2, 6-benzobisoxazole), and a poly(p-hydroxybenzoic acid)-co-2-hydroxy-6-naphthoic acid.

5. The high-frequency composite substrate of claim 1, wherein the insulating structure further comprises a plurality of liquid crystal polymer layers stacking each other.

6. The high-frequency composite substrate of claim 1, wherein the insulating structure further comprises an adhesive layer, and wherein the at least one liquid crystal polymer layer is disposed between the metal layer and the adhesive layer.

7. The high-frequency composite substrate of claim 6, wherein the adhesive layer is selected from the group consisting of an epoxy resin, a phenoxy resin, an poly (acrylic acid) resin, an polyurethane resin, a silicone rubber, a poly-p-xylene resin, a liquid crystal polymer, a bismaleimide resin, and a polyimide resin.

8. A high-frequency composite substrate, comprising:
a metal layer;
a polymer layer; and
at least one liquid crystal polymer layer, wherein the liquid crystal polymer layer is disposed between the polymer layer and the metal layer, wherein the liquid crystal polymer layer comprises a soluble liquid crystal polymer which comprises a repeating unit represented by formula below:

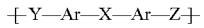

wherein Ar is 1,4-phenylene, 1,3-phenylene, 2,6-naphthalene, or 4,4'-biphenylene, Y is O, or NH, Z is C=O, and X is an amino group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, an (alkoxycarbonyl)oxy group, a hydroxyamino group, an alkoxyamino group, a cyanato group, an isocyanato group, or a combination thereof.

9. The high-frequency composite substrate of claim 8, wherein the soluble liquid crystal polymer is soluble in an N-Methyl-2-pyrrolidone, an N,N-dimethylacetamide, a γ-butyrolactone, a dimethylformamide, a 2-butoxyethanol, and a 2-eyhoxyethanol.

10. The high-frequency composite substrate of claim 9, wherein the soluble liquid crystal polymer comprises a liquid crystal polymer and an aromatic polymer selected from the group consisting of an aromatic polyester, an aromatic polyamide, a poly para-phenylene terephthalamide, a poly(p-phenylene-2, 6-benzobisoxazole), and a poly(p-hydroxybenzoic acid)-co-2-hydroxy-6-naphthoic acid.

11. The high-frequency composite substrate of claim 8, wherein the polymer layer comprises a material selected from the group consisting of a polyimide, a polytetrafluoroethylene, a polyethylene, a polypropylene, a polystyrene, a polyvinylchloride, a polyamide, a polyacidmethylester, an ABS plastic, a phenolic resin, an epoxy resin, a polyester, a polyethylene terephthalate, a silicone, a glass fiber, and a polyurethane.

12. The high-frequency composite substrate of claim 8, further comprising an adhesive layer, wherein the adhesive layer is disposed between the liquid crystal polymer layer and the metal layer.

13. The high-frequency composite substrate of claim 12, wherein the adhesive layer comprises a material selected from the group consisting of an epoxy resin, a phenoxy resin, an poly(acrylic acid) resin, an polyurethane resin, a silicone rubber, a poly-p-xylene resin, a liquid crystal polymer, a bismaleimide resin, and a polyimide resin.

14. A high-frequency composite substrate, comprising:
at least two metal layers; and
an insulating structure comprising a plurality of liquid crystal polymer layers disposed between the metal layers, wherein each liquid crystal polymer layer comprises a soluble liquid crystal polymer which comprising a repeating unit represented by formula below:

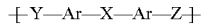

wherein Ar is 1,4-phenylene, 1,3-phenylene, 2,6-naphthalene, or 4,4'-biphenylene, Y is O, or NH, Z is C=O, and X is an amino group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, an (alkoxycarbonyl)oxy group, a hydroxyamino group, an alkoxyamino group, a cyanato group, an isocyanato group, or a combination thereof.

15. The high-frequency composite substrate of claim 14, wherein the soluble liquid crystal polymer is soluble in an N-Methyl-2-pyrrolidone, an N,N-dimethylacetamide, a γ-butyrolactone, a dimethylformamide, a 2-butoxyethanol, or a 2-eyhoxyethanol.

16. A liquid crystal polymer composition, comprising:
a solvent; and
an aromatic liquid crystal polyester, wherein aromatic liquid crystal polyester comprises a repeating unit represented by formula below:

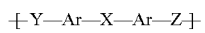

wherein Ar is 1,4-phenylene, 1,3-phenylene, 2,6-naphthalene, or 4,4'-biphenylene, Y is —O—, or —NH—, Z is C=O, and X is an amino group, an imido/imino group, an amidino group, an aminocarbonylamino group, an aminothiocarbonyl group, an aminocarbonyloxy group, an aminosulfonyl group, an aminosulfonyloxy group, an aminosulfonylamino group, an (alkoxycarbonyl)oxy group, a hydroxyamino group, an alkoxyamino group, a cyanato group, an isocyanato group, or a combination thereof.

17. The liquid crystal polymer composition of claim 16, wherein the solvent is selected from the group consisting of a 1-methyl-2-pyrrolidone, a dimethylacetamide, a gamma-butyrolactone, a dimethylformamide, a 2-butoxyethanol, and a 2-eyhoxyethanol.

18. The liquid crystal polymer composition of claim 16, wherein a weight percentage of the aromatic liquid crystal polyester is in the range of about 1 wt % to about 85 wt %, and a weight percentage of the solvent is in the range of about 15 wt % to about 99 wt %.

* * * * *